United States Patent
Suzuki

(10) Patent No.: US 9,315,377 B2
(45) Date of Patent: Apr. 19, 2016

(54) ACCELERATION SENSOR FOR DETECTING ACCELERATION IN THREE DIRECTIONS

(71) Applicant: Murata Manufacturing Co., Ltd., Nagaokakyo-shi, Kyoto (JP)

(72) Inventor: Toshihisa Suzuki, Hamamatsu (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 307 days.

(21) Appl. No.: 14/044,085

(22) Filed: Oct. 2, 2013

(65) Prior Publication Data

US 2014/0091404 A1  Apr. 3, 2014

(30) Foreign Application Priority Data

Oct. 2, 2012  (JP) .................................. 2012-220228

(51) Int. Cl.
| | |
|---|---|
| *G01P 15/125* | (2006.01) |
| *G01P 15/18* | (2013.01) |
| *B81B 3/00* | (2006.01) |
| *G01P 15/08* | (2006.01) |

(52) U.S. Cl.
CPC ............ *B81B 3/0078* (2013.01); *B81B 3/0018* (2013.01); *G01P 15/0802* (2013.01); *G01P 15/125* (2013.01); *G01P 15/18* (2013.01)

(58) Field of Classification Search
CPC ....... G01P 15/125; G01P 15/18; G01P 15/08; G01P 15/0802; G01P 15/0891; G01P 15/02
USPC ........ 73/514.32, 514.38, 514.16, 514.36, 510
See application file for complete search history.

(56) References Cited

U.S. PATENT DOCUMENTS

| | | | |
|---|---|---|---|
| 5,441,300 A | 8/1995 | Yokota et al. | |
| 5,487,305 A | 1/1996 | Ristic et al. | |
| 6,272,926 B1 | 8/2001 | Fehrenbach et al. | |
| 8,006,557 B2* | 8/2011 | Yin ..................... | G01C 19/5642 73/510 |
| 8,333,113 B2* | 12/2012 | Classen ................... | G01P 15/18 73/510 |
| 8,736,254 B2* | 5/2014 | Kanemoto .......... | G01P 15/0802 324/162 |
| 8,863,575 B2* | 10/2014 | Frangi ................... | G01P 15/125 73/514.32 |
| 8,910,523 B2* | 12/2014 | Shen ...................... | G01P 15/125 73/514.32 |

(Continued)

FOREIGN PATENT DOCUMENTS

| | | |
|---|---|---|
| JP | H05-340960 A | 12/1993 |
| JP | H06-258340 A | 9/1994 |

(Continued)

*Primary Examiner* — Helen Kwok
(74) *Attorney, Agent, or Firm* — Arent Fox LLP

(57) ABSTRACT

A first sensor section installed in an acceleration sensor employs a first elastic member which is elastically movable according to acceleration in the first and third directions and is stiff against acceleration in second direction so as to restrict elasticity in second direction. Thereby, the first sensor section is provided as a biaxial acceleration sensor which detects the first and third directional acceleration according to a change of electrostatic capacity between a first weight (i.e. the first movable electrode) made movable according to acceleration and the first fixed electrode. A second sensor section installed in the acceleration sensor is structurally identical with the first sensor section and configured to detect acceleration in second and third directions. Thereby, such combination of the first sensor section and the second sensor section constitutes a three-dimensional acceleration sensor.

11 Claims, 8 Drawing Sheets

(56) References Cited

U.S. PATENT DOCUMENTS

| | | | |
|---|---|---|---|
| 2003/0070484 A1* | 4/2003 | Itakura | G01D 5/2417 73/514.32 |
| 2004/0025591 A1* | 2/2004 | Yoshikawa | G01P 15/18 73/514.32 |
| 2004/0055382 A1 | 3/2004 | Samuels et al. | |
| 2004/0182157 A1* | 9/2004 | Sakai | G01P 15/125 73/514.32 |
| 2004/0182158 A1* | 9/2004 | Tsubaki | G01P 15/0802 73/514.32 |
| 2005/0262942 A1 | 12/2005 | Samuels et al. | |
| 2007/0119252 A1* | 5/2007 | Adams | G01P 15/0802 73/510 |
| 2007/0180912 A1 | 8/2007 | Judy et al. | |
| 2008/0011080 A1* | 1/2008 | Merassi | G01P 15/0891 73/510 |
| 2010/0024554 A1* | 2/2010 | Classen | G01P 15/125 73/514.32 |
| 2010/0107763 A1* | 5/2010 | Lin | G01P 15/125 73/514.32 |
| 2011/0154899 A1* | 6/2011 | Classen | G01P 15/125 73/514.32 |
| 2011/0270569 A1* | 11/2011 | Stephanou | G01C 19/5712 702/141 |
| 2012/0000287 A1* | 1/2012 | Frangi | G01P 15/18 73/514.32 |
| 2013/0042686 A1* | 2/2013 | Lin | G01P 15/125 73/514.32 |
| 2013/0099292 A1 | 4/2013 | Nakatani | |
| 2014/0069190 A1* | 3/2014 | Tanaka | G01P 15/125 73/514.32 |
| 2015/0040668 A1* | 2/2015 | Pasolini | G01P 15/125 73/514.32 |

FOREIGN PATENT DOCUMENTS

| | | |
|---|---|---|
| JP | H07-245413 A | 9/1995 |
| JP | 2773495 B2 | 7/1998 |
| JP | H11-344507 A | 12/1999 |
| JP | 3327595 B2 | 9/2002 |
| JP | 2005-534016 A | 11/2005 |
| JP | 2012-167941 A | 8/2012 |
| WO | WO 2012/002514 A1 | 1/2012 |

\* cited by examiner

ACCELERATION SENSOR FOR DETECTING ACCELERATION IN THREE DIRECTIONS

CROSS-REFERENCE TO RELATED APPLICATION

This application is based upon and claims the benefit of priority of the prior Japanese Patent Application No. 2012-220228, filed on Oct. 2, 2012, the entire contents of which are incorporated herein by reference.

FIELD

The present invention relates to an acceleration sensor achieved by implementing MEMS (micro electro mechanical system) technology.

BACKGROUND

Among acceleration sensors manufactured based on MEMS technology, there have been manufactured some acceleration sensors detecting a change of electrostatic capacity. For instance, an acceleration sensor of this type has a capacitor at a position between a fixed electrode fixed to a substrate and a movable electrode installed on a weight which is made relatively movable with respect to the substrate so as to detect acceleration associated with a change of electrostatic capacity in the capacitor (for instance, Japanese Laid-Open Patent Publication No. 11-344507). The acceleration sensor disclosed in Japanese Laid-Open Patent Publication No. 11-344507 is provided as a uniaxial acceleration sensor configured such that x-axis directional both ends of a weight (mass body) are connected to a substrate via supports fixed to the substrate and elastic members (for instance, springs) so as to allow the weight to move in the x-axis direction. Each of the springs used in the above uniaxial acceleration sensor is configured such that, in plane view (xy in-plane view), a long side and a short side are provided alternately and continuously so that the long side and the short side make a right angle, i.e., each long side of the spring stretches in y direction, in the Publication, perpendicular to elastic movement direction of the spring.

Besides the above-mentioned uniaxial acceleration sensor for detecting acceleration working in a single direction, there have been some three-dimensional acceleration sensors for detecting three dimensional acceleration, i.e., in x, y and z directions (for instance, Published Japanese Translation of PCT International Patent Application No. 2005-534016, Japanese Laid-Open Patent Publication No. 06-258340, Japanese Laid-Open Patent Publication No. 05-340960, Japanese Patent No. 2773495, Japanese Laid-Open Patent Publication No. 07-245413, Japanese Patent No. 3327595, etc.). For instance, an acceleration sensor disclosed in Translation Publication No. 2005-534016, is configured such that a weight is connected to a substrate through four connection sets each consisting of a spring and an arm fixed to the substrate so as allow the weight to move three dimensionally, i.e., with respect to x, y and z directions. Typically, acceleration working three dimensionally is detected according to a change of electrostatic capacity that is caused by a change of distance between movable electrodes installed on the weight and fixed electrodes in respective axis directions. A spring used in the above typical three-dimensional acceleration sensor is configured such that a long side and a short side are provided alternately and continuously and length of the long side and that of the short side are made almost equal.

SUMMARY

The following functions are required of the springs that serve to hold the weight of the above three-dimensional acceleration sensor. Specifically, it is required that the springs allow the weight to move three dimensionally (in x, y and z directions) according to acceleration working three dimensionally and also allow the weight to move by movement amount in proportion to constituent acceleration speed in each direction of x, y and z directions among acceleration speed applied thereto irrespective of movement direction of the weight. For instance, a spring for a three-dimensional acceleration sensor is configured to exhibit property such that spring constants of respective axial directions are made almost the same. However, acceleration sensors employing the above springs have had problems due to use of springs or weights unsatisfactorily finished through manufacturing process. For instance, an etching process for forming springs or weights could be the cause of width variation of finished spring or thickness variation of finished weight. That is, such variations consequently could cause the weight to have deviation of center of gravity, and could cause the weight to get twisted or to rotate. Consequently, such problems could allow the weight to detect acceleration in the direction to be covered by the weight as well as acceleration in other direction not to be covered by the weight, which could lower detection accuracy and production yield.

Further, typical three-dimensional acceleration sensors are required to detect acceleration with equivalent accuracy concerning respective axial directions where the acceleration works. Therefore, symmetrical configuration is desired. For instance, the three dimensional acceleration sensor disclosed in Translation Publication No. 2005-534016 includes the weight shaped into substantially square when seen from top. That is, the above three-dimensional acceleration sensor significantly scarifies degree of flexibility in designing shape of the weight for the sake of detection accuracy.

Meanwhile, for making-up a three-dimensional sensor, it is conceivable to use plural uniaxial acceleration sensors mentioned in the above. For instance, it is conceivable to arrange plural uniaxial acceleration sensors in the same plane so as to detect respective all of the directions, i.e., x, y and z directions where the acceleration works. Such configuration, however, makes the three-dimensional sensor large in size.

An object of the present invention is to provide an acceleration sensor improving accuracy in detecting acceleration while satisfying flexibility degree of setting area occupied by the art work and designing miniaturized one.

According to one aspect of the present invention, there is provided an acceleration sensor comprising:

a substrate;

a first elastic member that is fixed to the substrate at one end thereof and configured to move elastically according to acceleration with respect to two different directions one of which is a first direction parallel to a plane of the substrate and other one of which is a third direction perpendicular to the plane of the substrate;

a second elastic member that is fixed to the substrate at one end is thereof and configured to move elastically according to acceleration with respect to two different directions one of which is a second direction being perpendicular to the first direction and parallel to the plane of the substrate, and other one of which is the third direction;

a first weight which is connected to the other end of the first elastic member and movably supported apart from the substrate;

a second weight which is connected to the other end of the second elastic member and movably supported apart from the substrate; and a set of three sensor sections comprising a first sensor section, a second sensor section and a third sensor section which respectively detect acceleration in the first direction, acceleration in the second direction and acceleration in the third direction according to movement of the first weight and the second weight.

The above mentioned acceleration sensor employs the first elastic member configured to move elastically in the first and third directions as well as the second elastic member configured to move elastically in the second and third directions. The first weight and the second weigh are movably supported by the first elastic member and the second elastic member respectively, so as to be hung in the air over the substrate, both the first elastic member and the second elastic member being movable in two directions. According to movement of the first weight and the second weight, the first sensor section, the second sensor section and the third sensor section respectively detect acceleration in the first direction, acceleration in the second direction and acceleration in the third direction.

The first elastic member and the second elastic member are not elastic and movable with respect to all of the three directions used in a three-dimensional acceleration sensor but are stiff with respect to either one of two directions (first direction and second direction) making up the plane parallel with the substrate. Accordingly, the first and second elastic members that are stiff in one direction prevent the first and second weights from rotating even though the first and second weights have deviation of center of gravity due to deficiency in manufacturing process. Thereby, there can be obtained the acceleration sensor with improved detection accuracy of acceleration. Further, since property variation of the acceleration sensor in the course of manufacturing process is avoided, production yield of the acceleration sensor can be improved.

In the above acceleration sensor, the first weight and the second weight are supported by the first elastic member and the second elastic member respectively, so as to make the first weight and the second weight movable in two direction. Employment of thus configured first and second elastic members can eliminate structural restriction required of a weight used for a typical three-dimensional acceleration sensor. For instance, regarding a typical three-dimensional acceleration sensor, shape of a weight when seen from top is restricted to be a square one so as to detect acceleration of respective directions whereas shape of each of the first and second weights for the acceleration sensor of the present application is not restricted to square one. Therefore, flexibility in designing shapes of parts constituting the acceleration sensor can be improved.

Further, in comparison with a three-dimensional acceleration sensor consisting of three uniaxial acceleration sensors, according to the present application, an acceleration sensor equivalent with a three-dimensional acceleration sensor can be realized by using two biaxial acceleration sensors, one of which and other one of which respectively employing the first elastic member and second elastic member. Thereby, the number of sensors can be reduced and miniaturization of the device can be realized.

Additional objects and advantages of the embodiments will be set forth in part in the description which follows, and in part will be obvious from the description, or may be learned by practice of the invention. The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE PREFERRED EMBODIMENTS

Preferred embodiments of the present invention will be explained with reference to accompanying drawings. It is to be noted that some illustrations are depicted with dimension and reduction scale not the same as actual embodiment, for convenience of simple explanation.

Figure 1:
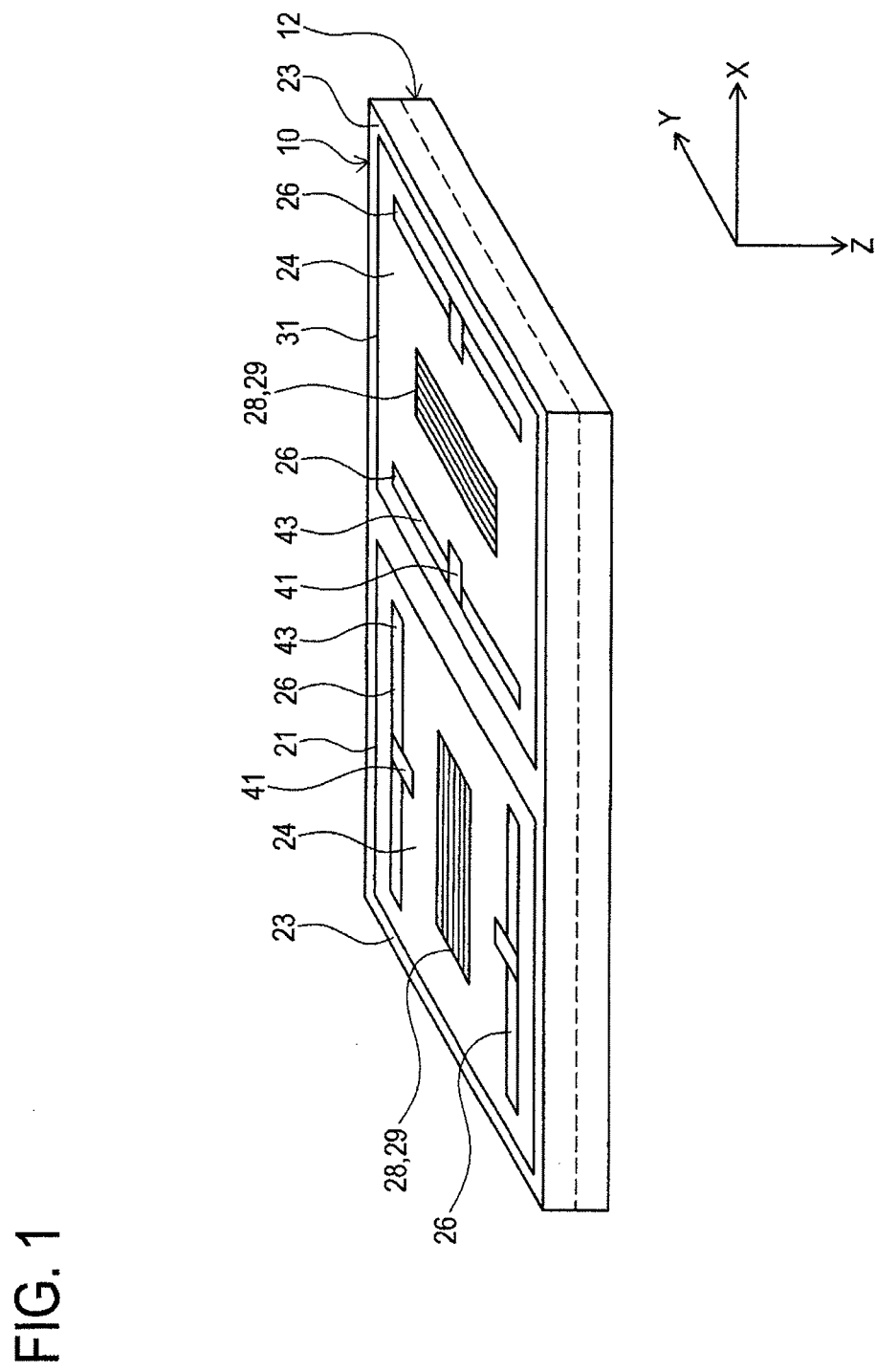
FIG. 1 is a perspective view for illustrating schematic configuration of an acceleration sensor according to an embodiment.

FIG. 1 shows schematic configuration of a chip constituting an electrostatic-capacity-type acceleration sensor of the present embodiment, which is manufactured by using MEMS (micro electro mechanical system) technology. As shown in FIG. 1, an acceleration sensor 10 includes a substrate 12 formed into a substantially rectangular shape when seen from top. Two chip regions are arranged side by side along the long side of the substrate 12. A first sensor 21 and a second sensor 31 are formed on the two chip regions. In the explanation hereinafter, as indicated in FIG. 1, an x-direction is regarded as direction running along the long side of the acceleration sensor 10 (i.e., the direction where the first sensor 21 and the second sensor 31 are arranged side by side), a y-direction is regarded as direction perpendicular to the x-direction, i.e., the direction parallel to the short side of the acceleration sensor 10 and a z-direction is regarded as direction to make a right angle with respect to both the x-direction and the y-direction (i.e., the direction perpendicular to a plane surface of the substrate 12).

Figure 2A:
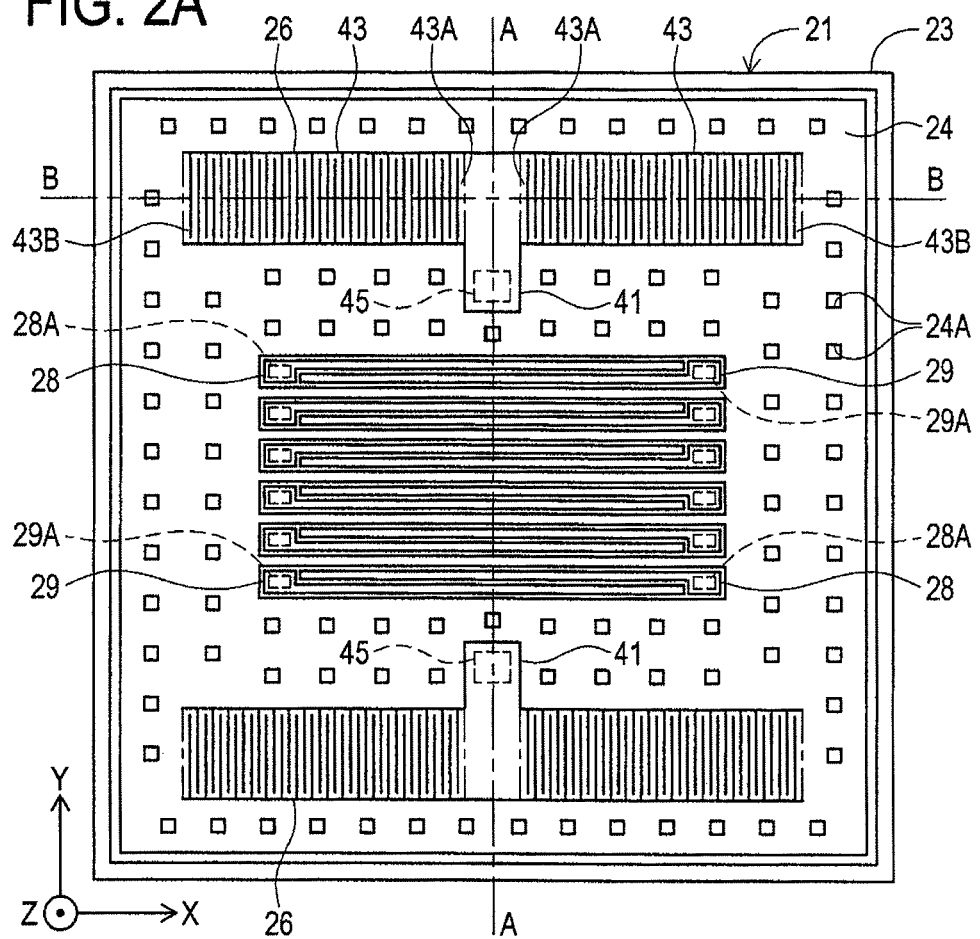
FIG. 2A is a plan view of a first sensor.

The first sensor 21 includes a frame 23, a weight 24, a pair of spring components 26, first fixed electrodes 28 and second fixed electrodes 29. As shown in FIG. 2A, the frame 23 is a square frame when seen from top and the weight 24 is disposed inside of the frame 23. The weight 24 is formed like a plate having a substantially square shape when seen from top. The weight 24 includes plural through holes 24A each penetrating through the weight 24 in the z-direction. The plural through holes 24A formed in the weight 24 are arranged in a matrix. In this connection, those through holes 24A work as air holes for reducing resist against the weight 24 in moving in the z-direction and as inlets for allowing injection of etchant used for etching a sacrificial layer to be described later.

The pair of spring components 26 are disposed in the y-direction on both sides of the first sensor 21. Each of the pair of spring components 26 consists of: a beam 41 disposed at substantially x-directional center of the first sensor 21; and a pair of springs 43 in the x-directional both sides. The beam 41 is formed like a plate having a substantially square shape when seen from top and arranged so that its long side should be directed in the y-direction. The weight 24 and the beam 41 are connected via the pair of springs 43. Each spring 43 has a zigzag-pattern-like shape when seen from top, wherein a fixed end 43A at its one end is fixed to a side surface of the beam 41 and a movable end 43B at its other end is connected to the weight 24. As will be described later, the zigzag-pattern-like shape of each spring 43 is configured such that long sides and short sides are alternately connected in a series so that a long side and a short side constituting the spring 43 make a right angle. That is, respective short sides of the spring 43 are directed in the x-direction and respective long sides thereof are in the y-direction so as to form right-angled-zigzag-like pattern. Further, regarding each spring 43, distance between the fixed end 43A to be fixed to the beam 41 and the movable end 43B to be connected to the weight 24 is made longer than the long side so that stiffness in the x-direction is enhanced and elasticity in the x-direction is restricted.

Figure 2B:
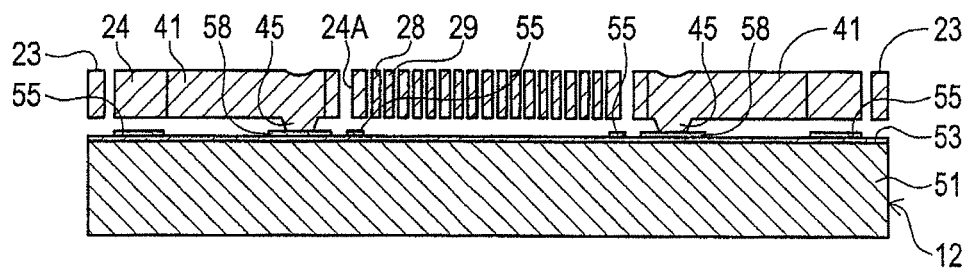
FIG. 2B is a cross-sectional view of FIG. 2A cross-sectioned along line A-A and FIG. 2C is a cross-sectional view of FIG. 2A cross-sectioned along line B-B.
Figure 2C:
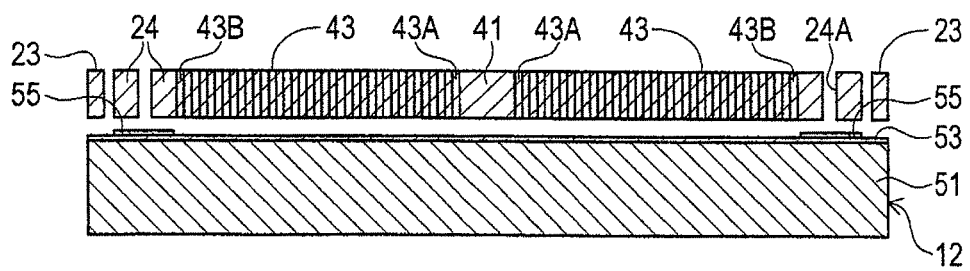

FIG. 2B is a cross-sectional view of FIG. 2A cross-sectioned along line A-A and FIG. 2C is a cross-sectional view of FIG. 2A cross-sectioned along line B-B. As shown in FIG. 2B, the beam 41 and an anchor 45 arranged upright on the substrate 12 are formed into integral structure. Therefore, as shown in FIG. 2C, the weight 24 is held by the pair of springs 43 fixed to the beam 41 at their respective one ends so that weight 24 hangs in the air over the substrate 12. Incidentally, the weight 24 and the frame 23 surrounding the weight 24 are arranged keeping space therebetween.

As shown in FIG. 2A, the first fixed electrodes 28 and the second fixed electrodes 29 are provided at substantially center of the first sensor 21. The first sensor 21 includes plural pairs (six pairs in the embodiment) of one of the first fixed electrodes 28 and one of the second fixed electrodes 29. Each of the first fixed electrodes 28 and each of the second fixed electrodes 29 are formed into a rectangular plate-like shape with its principal plane being directed in the z-direction and long side of the principal plane being directed in the x-direction. The first fixed electrodes 28 and the second fixed electrodes 29 are aligned along the y-direction so that their respective principal planes face one another. For electrical connection of the first fixed electrodes 28 and wires (not shown) formed on the substrate 12, six through holes 28A are provided at either one of x-directional sides (in FIG. 2A, upper three of them at the left side and lower three of them at the right side). Further, for electrical connection of the second fixed electrodes 29 and wires (not shown) formed on the substrate 12, six through holes 29A are provided at other one of x-directional sides opposite to the x-directional sides for the first fixed electrodes 28 (in FIG. 2A, upper three of them at the right side and lower three of them at the left side). Further, as shown in FIG. 2B, the first fixed electrodes 28 and the second fixed electrodes 29 are arranged apart from the substrate 12 except for end portions at which the through holes 28A or the through holes 29A are provided. In this connection, entirety of the first fixed electrodes 28 and the second fixed electrodes 29 including their respective end portions may electrically be connected to the substrate 12.

Figure 3:
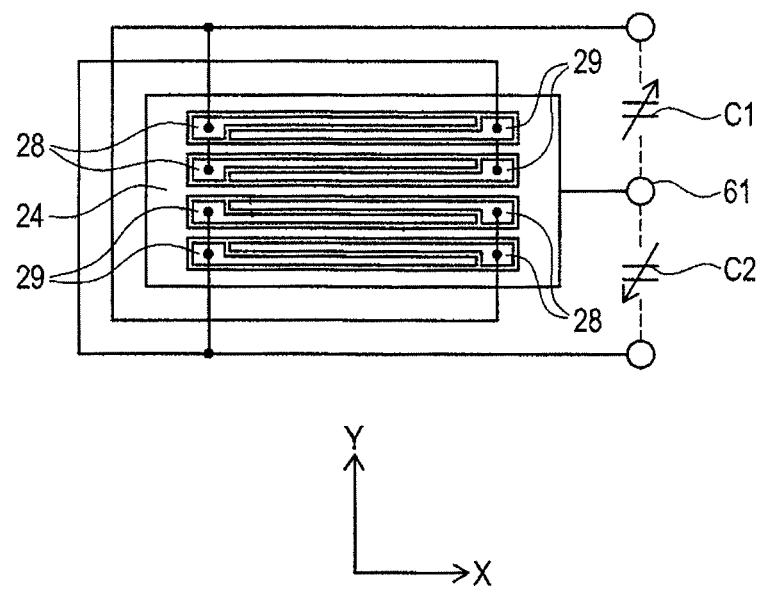
FIG. 3 is a view for illustrating electric connection of the acceleration sensor.

As shown in FIG. 2B, the substrate 12 includes: a core substrate 51; an insulating layer 53 formed to cover the top surface of the core substrate 51; and third fixed electrodes 55 each formed on the insulating layer 53. The anchor 45 of each of the pair of the spring components 26 integrally formed with the beam 41 is connected to a pad 58 and the weight 24 is electrically connected to an external terminal through wires (not shown). As shown in FIG. 3, the first sensor 21 is furnished with parallel plate capacitors C1, C2 consisting of the weight 24 serving as movable electrode and the first and second fixed electrodes 28, 29. The parallel plate capacitors C1, C2 vary their respective electrostatic capacity according to acceleration working in the y-direction with respect to the first sensor 21. For instance, in a case where the weight 24 moves toward one side (upward in FIG. 3) of the y-direction, electrostatic capacity of the parallel plate capacitor C1 is caused to decrease whereas that of the parallel plate capacitor C2 is caused to increase. Acceleration in the y-direction is detected by measuring respective electrostatic capacity of the parallel plate capacitors C1, C2 both being made variable according to a change of distance between the weight 24 and each of the first and second fixed electrodes 28, 29.

For instance, voltage value obtained at a measurement point 61 connected to the weight 24 is subsequently outputted to a processing circuit through the above mentioned external terminal so as to calculate acceleration on speed by detecting voltage difference between the parallel plate capacitors C1, C2 (difference of electrostatic capacity). As shown in FIG. 3, the first sensor 21 is constituted in a form of a bridge circuit inclusive of the parallel plate capacitors C1, C2 so as to make output difference between those capacitors large for improvement of sensitivity. Further, by constituting the bridge circuit, a change of electrostatic capacity at the respective capacitors C1, C2 with respect to the x-direction which is a direction that cannot be detected by the first sensor 21 is canceled. Thereby, sensitivity of the direction that cannot be detected can be reduced. Further, the first sensor 21 may optionally include a correction circuit for canceling an offset voltage measured at the measurement point 61, the offset voltage being a voltage detected even when load is absent due to absence of acceleration.

It is to be noted that each of the third fixed electrodes 55 indicated in FIG. 2B is widely formed on the insulating layer 53 so as to face the weight 24 in the z-direction. Thus, the first sensor 21 is constituted in a form of parallel plate capacitors wherein the weight 24 and the third fixed electrodes 55 are configured to face each other with respect to the z-direction. Those parallel plate capacitors vary their respective electrostatic capacity according to acceleration working in the z-direction with respect to the first sensor 21. In the first sensor 21, acceleration in the z-direction is detected by measuring respective electrostatic capacity of those parallel plate capacitors each being made variable according to a change of distance between the weight 24 and each of the third fixed electrodes 55.

As described in the above, the first sensor 21 is configured to detect acceleration working in the y-and-z-directions. Each of the springs 43 (see FIG. 2A) is configured not to move elastically with respect to the x-direction so that weight 24 should not move in the x-direction. Accordingly, the first sensor 21 is provided as a bi-axial acceleration sensor capable of detecting acceleration working in the y-and-z-directions. As shown in FIG. 1, the second sensor 31 provided for the acceleration sensor 10 is structurally similar to the first sensor 21. That is, the second sensor 31 includes a frame 23, a weight 24, a pair of spring components 26, first fixed electrodes 28, second fixed electrodes 29 and third fixed electrodes (not shown). The second sensor 31 is similar to the first sensor 21 being rotated by 90 degrees with reference to rotation axis in the z-direction. That is, the second sensor 31 is configured to detect acceleration working in the x-and-z-directions. Each of the springs 43 constituting the pair of spring components 26 is configured not to move elastically with respect to the y-direction so that weight 24 should not move in the y-direction. Accordingly, the second sensor 31 is provided as a bi-axial acceleration sensor capable of detecting acceleration working in the x-and-z-direction.

In the thus configured acceleration sensor 10, acceleration with respect to the three directions is detected based on outputs from the first sensor 21 and the second sensor 31. Further, the acceleration sensor 10 detects acceleration in the z-direction by making the first sensor 21 and the second sensor 31 measure a change of their respective electrostatic capacity each of which is variable according to a change of distance between their respective weights 24 and their respective third fixed electrodes 55. That is, the acceleration sensor 10 detects acceleration in the z-direction using a value obtained by summing up outputs from the first sensor 21 and the second sensor 31.

Next, there will be described on configuration of the spring 43.

Figure 4A:
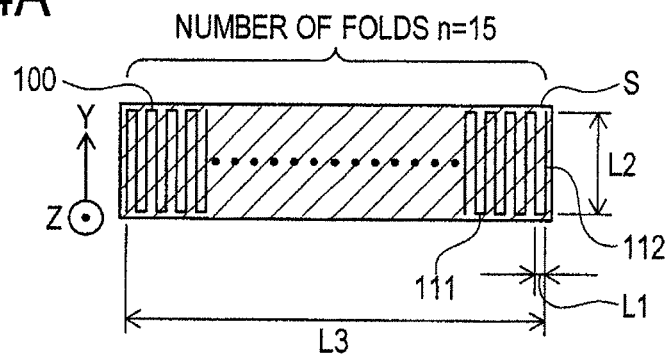
FIG. 4A is a view for illustrating a spring used in the embodiment and FIG. 4B and FIG. 4C are views for illustrating springs of comparative examples.
Figure 4B:
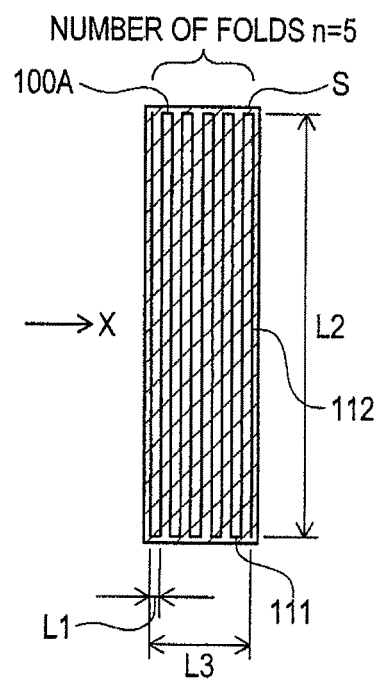
Figure 4C:
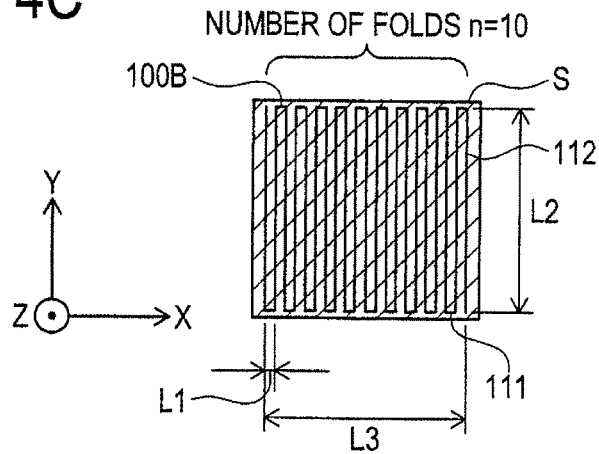

A spring 100 illustrated in FIG. 4A is an example of the spring 43. As already mentioned, the spring 100 is configured such that short sides 111 and long sides 112 are alternately connected in a series so that a short side 111 and a long side 112 constituting the spring 100 make a right angle. In the following description, as shown in FIG. 4A through FIG. 4C, length of the short side 111 and that of the long side 112 will be referred to as L1 and L2, respectively. Further, directions indicated with arrows in FIG. 4A through FIG. 4C show direction where respective springs 100, 100A and 100B elastically move.

The spring 100 is configured such that L2 is longer than L1 and L2 is shorter than length L3 which is end-to-end length of the spring 100 to be connected to the weight 24 (see FIG. 2A) and the beam 41 (see FIG. 2A). Here, it is supposed that n stands for the number of turns at the y-direction to make a shape of the spring 100, i.e., the number of turns made at either one of y-directional ends (termed as "number of folds" hereinafter). Here, 15 is the number of folds to make the shape of the spring 100 shown in FIG. 4A. Regarding the spring 100, there is correlation between the number of folds n and an x-directional spring constant Kx, a y-directional spring constant Ky and a z-directional spring constant Kz. Through evaluations and simulation with respect to changes of spring constants Kx, Ky, Kz each of which is changeable depending on the number of folds n, the inventor and researchers involving in this matter have reached the idea of the present invention. More specifically, as shown in FIG. 4A, under the condition wherein an area to be occupied by the spring 100 should be constant, i.e., a superficial area S (indicated with hatching in FIG. 4A) to be occupied by the spring 100 in a plane perpendicular to the z-direction should be constant while the number of folds n is changed, evaluations on changes of spring constants Kx, Ky, Kz were carried out.

Figure 5:
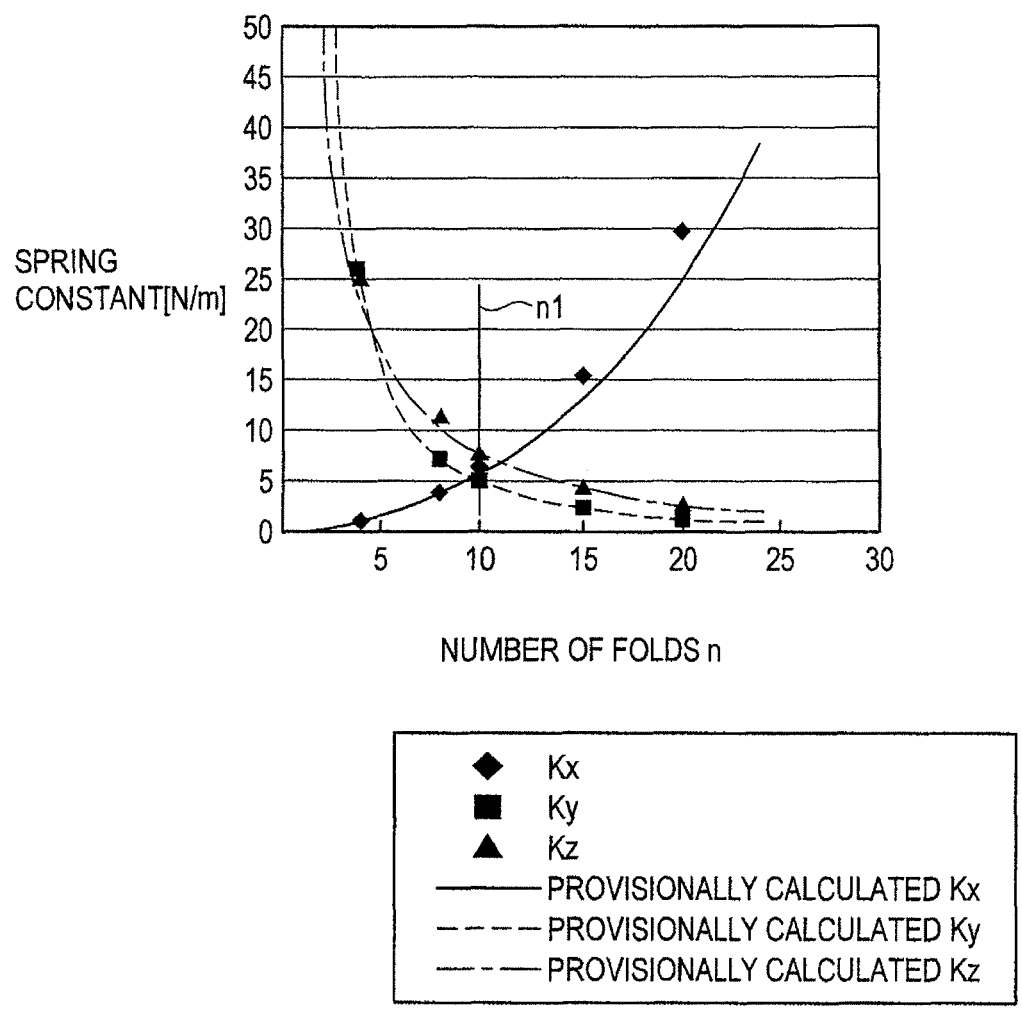
FIG. 5 is a graph for illustrating relation of spring constant and the number of folds.

FIG. 5 is a graph showing respective spring constants Kx, Ky, Kz with reference to the number of folds n. As shown in FIG. 5, the x-directional spring constant Kx increases as the number of folds n increases. The graph indicated with solid line shows a result of calculations of the x-directional spring constant Kx. From the graph of Kx, it is found that stiffness in the x-direction is enhanced and elasticity in the x-direction is restricted as the number of folds n increases.

Meanwhile, the y-directional spring constant Ky decreases as the number of folds n increases. The graph indicated with broken line shows a result of calculations of the y-directional spring constant Ky. From the graph of Ky, it is found that stiffness in the y-direction is weakened and the spring is made to move more easily in the y-direction as the number of folds n increases. In similar with Ky, the z-directional spring constant Kz decreases as the number of folds n increase. The graph indicated with long dashed short dashed line shows a result of calculations of the z-directional spring constant Kz. From the graph of Kz, it is found that stiffness in the z-direction is weakened and the spring is made to move more easily in the z-direction as the number of folds n increases.

Based on the above evaluation results, the spring 100 shall be classified into three types depending on spring constants Kx, Ky, and Kz. For instance, given that the number of folds n that approximates the spring constants Kx, ky and Kz to a substantially equivalent value is defined as reference value n1 (for instance n1=10), a spring 100 classified as "type 1" is configured such that the number of folds n is smaller than the reference value n1. For instance, as shown in FIG. 4B, a spring 100A of which number of folds n is 5 is classified into the "type 1" spring. The spring 100A is configured such that end-to-end length L3 thereof is shorter than length L2, thereby the spring 100A is made to move in the x-direction easily and elastic movement in the y directions is restricted. That is, the spring 100A is elastic in one direction and corresponds to a type of the spring employed by the uniaxial acceleration sensor disclosed in Japanese Laid-Open Patent Publication No. 11-344507.

Next, a spring 100 classified as type 2 is configured such that the number of folds n is the same as the reference value n1 and the spring constants Kx, Ky and Kz approximate to a substantially equivalent value. For instance, as shown in FIG. 4C, a spring 100B of which number of folds n is 10 is classified into the "type 2" spring. The spring 100B is configured such that end-to-end length L3 thereof is almost the same as length L2, thereby the spring 100B is made to move in any of the x, y and z directions. That is, the spring 100B is elastic and movable in any of the x, y and z directions and corresponds to a type of the spring employed by the three-dimensional acceleration sensor disclosed in Japanese Translation of PCT International Patent Application No. 2005-534016.

The spring 100 shown in FIG. 4A is classified as "type 3" spring which is configured such that the number of folds n is larger than the reference value n1. The spring 100 exhibits movability in two directions. More specifically, the spring 100 is stiff in the x-direction at which a short side 111 and a long side 112 in a series make turn like a zigzag pattern. Therefore, the spring 100 is difficult to move elastically in the x-direction. Further, the spring 100 is movable in the y-direction which is perpendicular to the x-direction where the spring makes turns in a zigzag manner. Also, the spring 100 is movable in the z-direction which is perpendicular to the plane in which the area S to be occupied by the spring 100 is set. Accordingly, concerning the first sensor 21 that employs the spring 100 (equivalent to spring 43) exhibiting the above mentioned properties, acceleration working in the y-direction and acceleration working in the z-direction are detected whereas the weight is not allowed to move in the x-direction so as to suppress sensitivity of acceleration in the not-to-be detected detection, i.e., the x-direction. Thereby, detection accuracy can be improved.

Next, there will be described on sensitivity of the thus configured acceleration sensor 10.

The acceleration sensor 10 is configured to detect acceleration in the z-direction using outputs from the first and second sensors 21 and 31. Given that area of movable electrodes facing fixed electrodes in the z direction of the first and second sensors 21 and 31 is defined as "S", distance between the electrodes as "d" and conductivity as "ϵ", electrostatic capacity C is expressed with the below indicated equation.

$$C = \epsilon S/d \quad (1)$$

The weight 24 is formed into a plate-like shape of which plane surface is directed perpendicular to the z-direction. Therefore, the area S of the movable electrode for detecting acceleration in the z-direction can be made larger in comparison with others for detecting acceleration in other directions (x-direction and y-direction). Accordingly, concerning each of the first sensor 21 and the second sensor 31 of the present embodiment, scale of electrostatic capacity for detecting acceleration in the z-direction can be made large in the other directions.

By using the above equation (1), degree of electrostatic capacity variation "ΔC" to distance variation "Δd" can be expressed with the below indicated equation.

$$\Delta C/\Delta d = \epsilon S/d^2 \quad (2)$$

Further, in view of equations of motion and the law of elasticity, force working on the weight 24 can be expressed with the below indicated equation.

$$F = ma = k\Delta d \quad (3)$$

(m: mass of weight 24, a: acceleration, k: spring constant)

In view of the above equations (2), (3), electrostatic capacity variation "ΔC" can be expressed with the below indicated equation.

$$\Delta C = (\epsilon S/d^2 * m/k)a = (C/k * m/d)a \quad (4)$$

Accordingly, judging from the above equation (4), the following means can be conceived for enhancing sensitivity to acceleration "a" (electrostatic capacity variation) that the electrostatic-capacity-type acceleration sensor 10 of the present embodiment should hold. The particular means are: increasing mass "m" of the weight 24; increasing electrostatic capacity "C" of the capacitor consisting of the weight 24, the first fixed electrodes 28, the second fixed electrodes 29 and the third fixed electrodes 55; or lowering the respective spring constants Kx, Ky, Kz. In this connection, the mass "m" is correlated with size of the weight 24 and the electrostatic capacity "C" is correlated with an area "S" of movable electrodes of which plane is directed perpendicular to the z-direction of the weight 24. As shown in FIG. 2A, it is the weight 24 that occupies most part of plane area of the acceleration sensor 10 when seen from top. Meanwhile, as exemplary configuration of multi-axial acceleration sensor consisting of plural uniaxial acceleration sensors (such as acceleration sensor disclosed in Japanese Laid-Open Patent Publication No. 11-344507) for detecting each of the x, y and z directions, there may be conceived of the configuration to arrange plural acceleration sensors on the same plane. However, when the configuration of acceleration sensor disclosed in Japanese Laid-Open Patent Publication No. 11-344507 is seen from top, it is found that the weight involving in the z-directional acceleration detection occupies a small a part in the plane view of the configuration. That is, the acceleration sensor 10 of the present embodiment is configured such that all of the sensors (the first sensor 21 and the second sensor 31) installed therein cover acceleration in the z-direction. Therefore, the acceleration sensor 10 of the present embodiment can achieve excellence in miniaturizing its dimension in comparison with a different-type three-dimensional acceleration sensor of which sensitivity of acceleration in the z-direction is the same as that of the present embodiment.

Concerning sensitivity of an electrostatic-capacity-type acceleration sensor, generally, substantially equal sensitivity in each of x, y and z directions is favorable. From the equation (4), for realizing substantially equal sensitivity in each of x, y and z directions, it is possible to equalize ratio of electrostatic capacity C and spring constant k with respect to each of x, y and z directions. For instance, hereinafter, there will be described given that the following definitions are applied to the above mentioned acceleration sensor 10. Firstly, concerning the second sensor 31 for detecting acceleration in the x-direction, there are given definitions such that "Cx" stands for electrostatic capacity between the weight 24 and the first and second fixed electrodes 28 and 29, and "kx" stands for a spring constant of the second sensor 31 with respect to the x-direction. Secondly, concerning the first sensor 21 for detecting acceleration in the y-direction, there are given definitions such that "Cy" stands for electrostatic capacity between the weight 24 and the first and second fixed electrodes 28 and 29, and "ky" stands for a spring constant of the first sensor 21 with respect to the y-direction. Since the first sensor 21 and the second sensor 31 of the present embodiment are structurally identical, electrostatic capacity Cx and the x-directional spring constant kx set for the first sensor 21 are respectively substantially the same as electrostatic capacity Cy and the y-directional spring constant ky set for the second sensor 31. Concerning the first sensor 21 for detecting acceleration in the z-direction, there are further given definitions such that "Cz1" stands for electrostatic capacity between the weight 24 and the third fixed electrode 55, and "kz1" stands for a spring constant of the spring 43 with respect to the z-direction. Concerning the second sensor 31 for detecting acceleration in the z-direction, there are further given definitions such that "Cz2" stands for electrostatic capacity between the weight 24 and the third fixed electrode 55, and "kz2" stands for a spring constant of the spring 43 with respect to the z-direction. Since the first sensor 21 and the second sensor 31 of the present embodiment are structurally identical, electrostatic capacity Cz1 and the spring constant kz1 set for the first sensor 21 are respectively substantially the same as electrostatic capacity Cz2 and the spring constant kz2 set for the second sensor 31.

To make the ratio between electrostatic capacity C and spring constant k of each direction equal, it is required to satisfy the below indicated equation.

$$2*Cx/kx = 2*Cy/ky = (Cz1/kz1 + Cz2/kz2) \quad (5)$$

Accordingly, by designing a sensor so as to approximate its electrostatic capacity and spring constant to those satisfying the above equation (5), sensitivity of acceleration in each of the three axial directions perpendicular to one another can be made similar and designing the acceleration sensor 10 can be simplified. Incidentally, as shown in FIG. 3, each of the first sensor 21 and the second sensor 31 is constituted in a form of a bridge circuit inclusive of the parallel plate capacitors C1, C2 so as to calculate acceleration speed by using electrostatic capacity difference between capacitor C1 and capacitor C2. Accordingly, for each of the sensors 21 and 31, sensitivity of each direction is correlated with a doubled value of capacity directed to either one of the capacitors C1, C2. Thus, the above equation (5) is established in consideration of characteristics of a bridge circuit used for an electrostatic-capacitor-type acceleration sensor.

Next, an exemplary manufacturing method of the first sensor 21 will be described. Incidentally, description about a manufacturing method of the second sensor 31 will be omitted as being similar with manufacturing method of the first sensor 21.

Figure 6A:
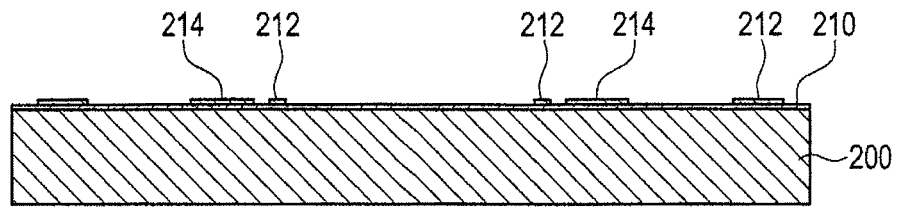
FIG. 6A, FIG. 6B and FIG. 6C are cross-sectional views for illustrating manufacturing process of the acceleration sensor.

Firstly, a core substrate 200 shown in FIG. 6A is prepared. The core substrate 200 is a wafer made of single crystal silicone, for instance. Considerable number of sensor elements are formed on the core substrate 200 and dicing treatment is subsequently applied, whereby plural first sensors 21 are singulated therefrom.

An insulating layer 210 is formed on a top surface of the core substrate 200. The insulating layer 210 is made of silicon nitride (SiNx) or a film obtained by laminating silicon nitride on a silicon dioxide film by using thermal oxidation method or deposition method, for instance. Next, on the top surface of the insulating layer 210, there are subsequently formed the third fixed electrodes 212 arbitrarily patterned by using photolithography technology, pads 214, and not-shown wires. The third fixed electrodes 212 and wires (not shown) are made by using polysilicon or such like material which exhibits resistance property against etching of a later-described sacrificial layer 215. Incidentally, in a case where the third fixed electrodes 212 and the not-shown wires are formed by using aluminum that is generally used in the LSI technology, it is preferable that the aluminum used therein is covered by a silicon nitride film or the aluminum layer is formed in the middle of the insulating layer 210 consisting of plural laminations so as to enhance resistance property against etching of the sacrificial layer 215. As described, the insulating layer 210, each third fixed electrode 212 and each wire (not shown) may be made up by laminating plural layers. Also, each third fixed electrode 212 and each wire may be made up by laminating plural layers exhibiting conductivity.

Figure 6B:
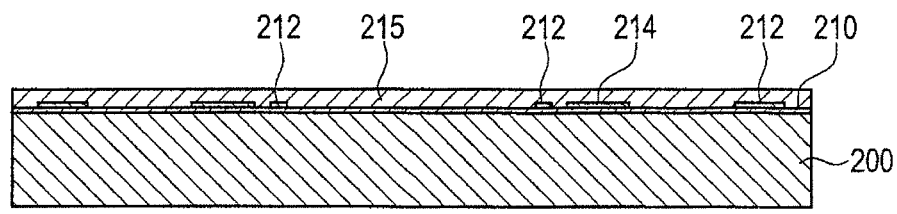
Figure 6C:
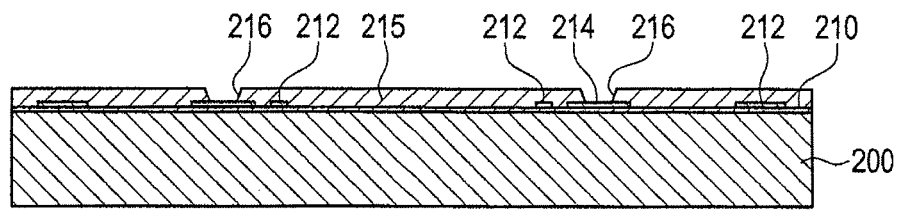

Next, as shown in FIG. 6B, a sacrificial layer 215 is formed so as to thoroughly cover both the insulating layer 210 and the third fixed electrodes 212. The sacrificial layer 215 is formed by making a silicon dioxide film according to CVD (chemical vapor deposition) method, for instance. Thickness of the sacrificial layer 215 is set to 2 μm, for instance. Next, as shown in FIG. 6C, contact holes 216 are formed so that a part of each pad 214 is exposed to the air through the sacrificial layer 215. The contact holes 216 are formed by using photolithography technology, for instance.

Figure 7A:
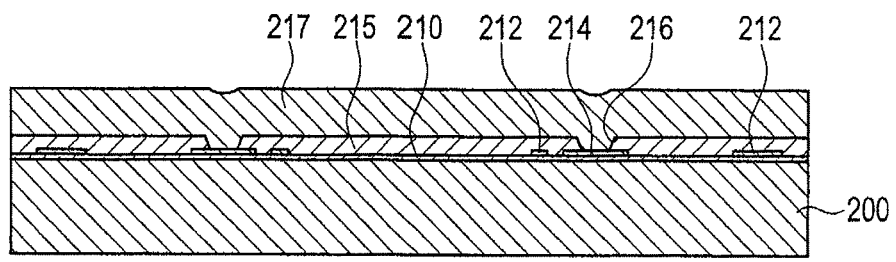
FIG. 7A, FIG. 7B and FIG. 7C are cross-sectional views for illustrating manufacturing process of the acceleration sensor.
Figure 7B:
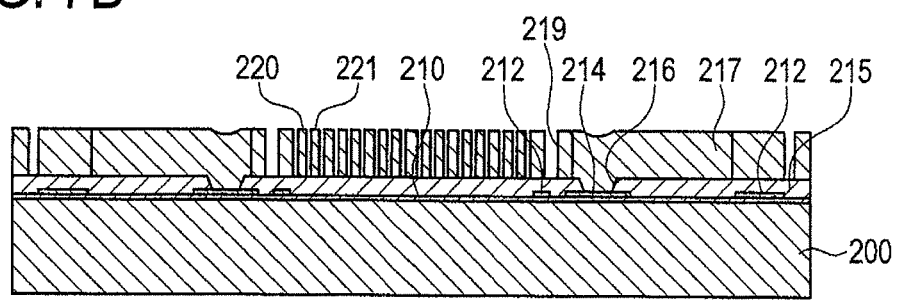

Next, as shown in FIG. 7A, an electrode layer 217 is formed on the sacrificial layer 215. When the electrode layer 217 is formed, the contact holes 216 are filled with the electrode layer 217. The electrode layer 217 is formed by making a polysilicon film according to CVD method, for instance. Thickness of the electrode layer 217 is set to 5-10 μm, for instance. Next, as shown in FIG. 7B, etching process is applied to the electrode layer 217 so as to form a through hole 219, a first fixed electrode 220 and a second fixed electrode 221. The etching process to the electrode layer 217 is performed in such a manner that a resist (not shown) arbitrarily patterned by using photolithography technology is formed on the electrode layer 217, and anisotropic etching process is subsequently applied to a region exposed to the air from an opening portion of the resist by using Deep-RIE (reactive iron etching). Although not shown, a spring 43 is formed by taking manufacturing steps similar to the steps taken for manufacturing the first fixed electrode 220 and the second fixed electrode 221, for instance.

Figure 7C:
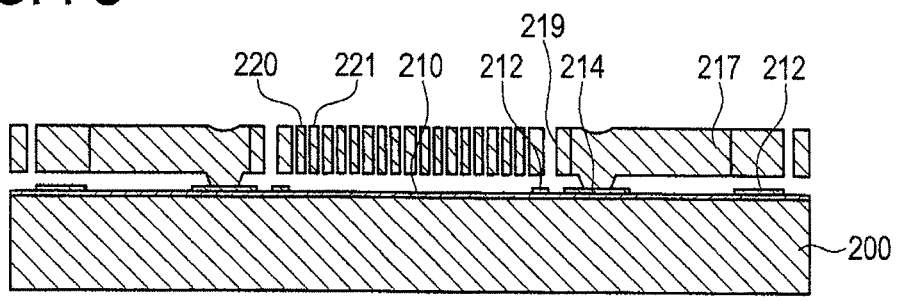

Next, as shown in FIG. 7C, etching process is applied to the sacrificial layer 215. The etching process to the sacrificial layer 215 is performed by pouring etchant (e.g., buffered hydrofluoric acid, (BMF)) from the through holes 219 formed in the electrode layer 217, for instance. Thus, the first sensor 21 shown in FIG. 1 is formed.

According to the present embodiment, the following effects are brought.

(1) Concerning the first sensor 21 installed in the acceleration sensor 10, each of the pair of springs 43 used in the first sensor 21 is configured to move elastically according to acceleration working in the y-direction and acceleration working in z-directions while being prevented from elastically moving in the x-direction according to acceleration in the x-direction. Thereby, acceleration in the y-direction and acceleration in the z-direction are detected according to a change of electrostatic capacity between the weight 24 made movable according to acceleration and the first through third fixed electrodes 28, 29, 55. That is, each of the pair of springs 43 used in the first sensor 21 is stiff in the x-direction so that the first sensor 21 works as a biaxial acceleration sensor. The second sensor 31 installed in the acceleration sensor 10 is structurally identical with the first sensor 21 wherein the difference lies in that the second sensor 31 is configured to detect acceleration in the x-direction and acceleration in the z-direction. Thereby, thus combined installation of the first sensor 21 and the second sensor 31 constitutes a three-dimensional acceleration sensor. In the thus configured three-dimensional acceleration sensor, each of the pair of springs 43 used in the respective sensors 21 and 31 for holding their respective weights 24 is stiff in one direction. Therefore, each of the pair of springs 43 being stiff in one direction prevents a weight 24 from rotating even though the weight 24 has deviation of center of gravity due to deficiency in manufacturing process. Thereby, there can be obtained the acceleration sensor 10 with improved detection accuracy of acceleration.

(2) The acceleration sensor 10 is configured to detect acceleration working in the z-direction by summing up outputs from the first sensor 21 and the second sensor 31 with respect to acceleration in the z-direction. Since all of the sensors (first sensor 21 and second sensor 31) installed in the acceleration sensor 10 involve in detection of acceleration in the z-direction, the acceleration sensor 10 can achieve excellence in miniaturizing its dimension in comparison with a different-type three-dimensional acceleration sensor consisting of three uniaxial acceleration sensors.

(3) When the first sensor 21 is seen from top, each of the pair of springs 43 used therein is positioned such that its movable end 43B is closer to the outside than its fixed end 43A. Owing to the thus positioned each of the pair of springs 43, influence of rotation moment working on the weight 24 is reduced and detection accuracy of the first sensor 21 can be improved.

Although the embodiments of the present invention have been described in detail, it should be understood that the various changes, substitutions, and alterations could be made hereto without departing from the spirit and scope of the invention.

Figure 8:
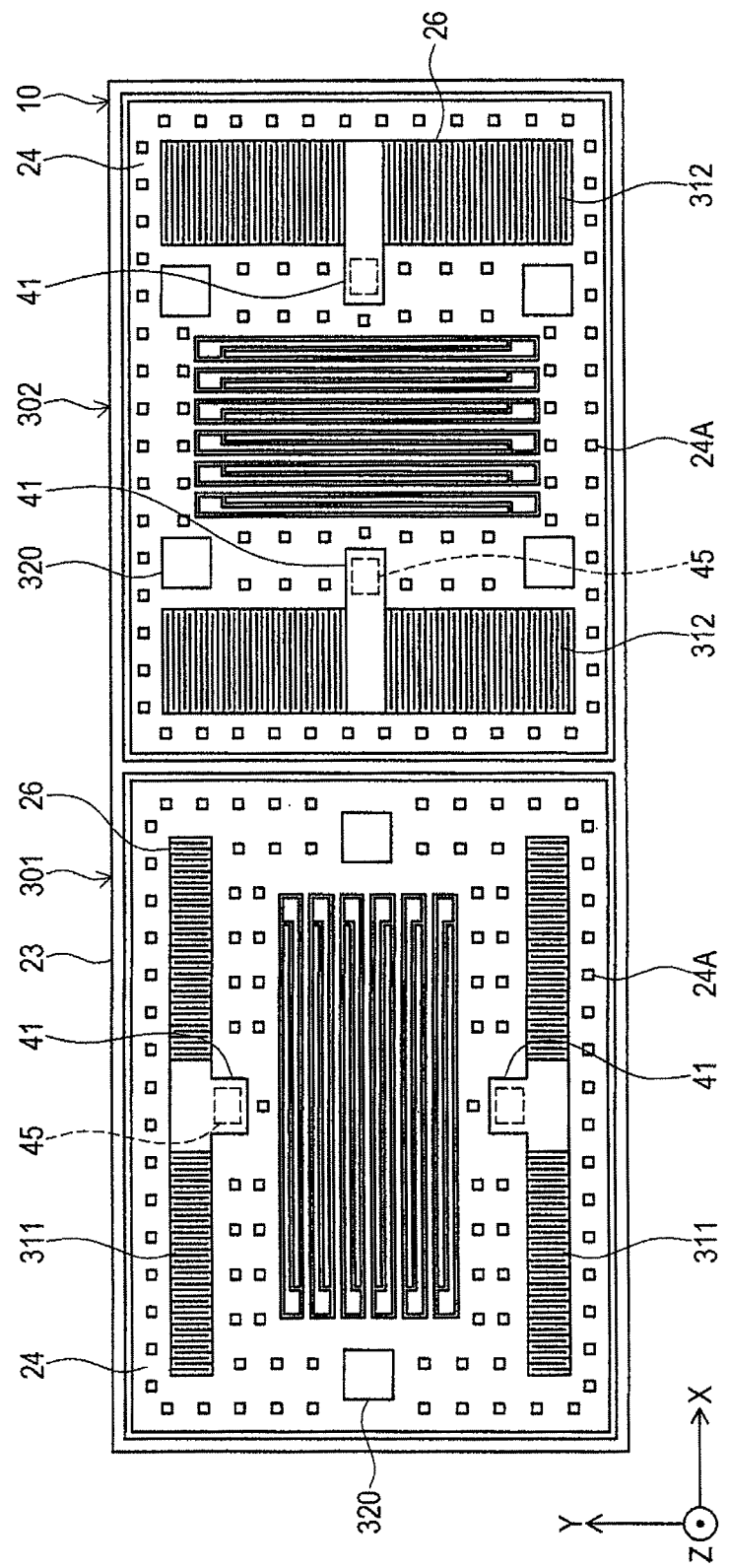
FIG. 8 is a perspective view for illustrating schematic configuration of another acceleration sensor.

The first sensor 21 is a substantially square shape when seen from top, but the shape of the first sensor 21 is not restricted to that shape. For instance, each of a first sensor 301 and a second sensor 302 shown in FIG. 8 is a substantially rectangular shape when seen from top. Each of the first sensor 301 and the second sensor 302 is formed into a substantially rectangular shape of which long side extends in the x-direction when seen from top. Each spring 311 used in the first sensor 301 is configured such that its x-directional length is made longer and its y-directional length is made shorter in comparison with the x-directional length and y-directional length of each spring 43 used in the first sensor 21. Each spring 312 used in the second sensor 302 is configured such that its x-directional length is made longer and its y-directional length is made shorter in comparison with the x-directional length and y-directional length of each spring 43 used in the second sensor 31. Despite proportional difference in the x-and-y-directions, both springs 311 and 312 are also stiff in one direction. Therefore, each of the first sensor 301 and the second sensor 302 can be used as a biaxial acceleration sensor. That is, the thus configured first sensor 21 and second sensor 31 can reduce structural restriction and improve degree of flexibility in designing shape.

Although it is not particularly mentioned in the above embodiment, each of the first sensor 301 and the second sensor 302 shown in FIG. 8 includes stoppers 320 for preventing stiction between the weight 24 and other parts thereof. Each stopper 320 is arranged upright on the substrate 12 (refer to FIG. 1) like a pillar penetrating the weight 24 in the z-direction. Each stopper 320 gets engaged with the weight 24 so as to prevent the weight 24 from sticking to other parts such as the first fixed electrodes 28, for instance. Further, although it is not shown, a convex portion is arranged on the stopper 320 at its surface facing the weight 24, whereby contact area of the stopper 320 and the weight 24 is reduced for effect avoidance of stiction therebetween. Further, the above such convex portion may be arranged on other portion such as the anchor 45 at its surface facing the weight 24 so as to work as stopper 320. Further, the configuration to avoid stiction is not restricted to the stopper 320. Hydrophobic material may be applied to an edge surface of arbitrary part for avoiding stiction.

Although the weight 24 is used as movable electrode in the embodiments, a movable electrode may be provided integrally with the weight 24 or separately from the weight 24.

Further, acceleration may be detected by constituent so elements other than electrostatic capacitors as long as the constituent elements are configured to allow the acceleration sensor 10 to detect acceleration working thereon by using elastic members, such like the spring 43 which is elastic or movable in two directions.

Shapes of respective elements, configuration, etc. are is merely exemplarily shown and may be modified properly within the gist of the present invention. For instance, the first sensor 21 and the second sensor 31 may be made different in configuration within the gist of the present application.

Incidentally, the acceleration sensor 10 is an example of an acceleration sensor. The weight 24 is an example of first and second weights and first and second movable electrodes. The first through third fixed electrodes 28, 29, 55 are examples of first through third fixed electrodes. The second sensor 31 and the first sensor 21 are an example of a first sensor section and a second sensor section, respectively. Integration of measurement with the first sensor 21 and measurement with the second sensor 31 for measuring changes of their respective electrostatic capacity each of which is variable according to a change of distance between their respective weights 24 and their respective third fixed electrodes 55 is an example of the third sensor section. Parallel plate capacitors C1, C2 consisting of the weight 24 and the first and second fixed electrodes 28, 29 are examples of the first and second electrostatic capacitors. A capacitor with capacitance summing up ones provided between the respective weights 24 of the first and second sensors 21, 31 and their respective third fixed electrodes 55 is an example of the third electrostatic capacitor. The respective weights 24 of the first and second sensors 21, 31 facing their respective third fixed electrodes 55 is an example of the third movable electrode. The pair of spring components 26 and the spring 43 are an example of a first elastic member and that of a second elastic member, and also example of a first spring structure and that of a second spring structure. X-direction, y-direction and z-direction are examples of first, second and third directions, respectively.

The spring 100 is an example of a second elastic member, and also example of a second spring structure. The long side 112 and the short side 111 of the spring 100 are an example of a side stretching in the second direction and that of a side stretching in the first direction, respectively. When the spring 100 is rotated by 90 degrees, the spring 100 is an example of a first elastic member, and also example of a first spring structure, and the long side 112 and the short side 111 of the spring 100 are an example of a side stretching in the first direction and that of a side stretching in the second direction, respectively. The spring constants Kx, Ky, Kz are examples of spring constants.

Next, there will be described technical ideas that can be led from the above mentioned embodiments.

In the acceleration sensor disclosed in the present application, the third sensor section may include a first electrostatic capacitor corresponding to the first sensor and a second electrostatic capacitor corresponding to the second sensor. Further, values of the below provided three expressions may be set equal to one another:

2*{(capacity of the first electrostatic capacitor in the first sensor)/(the spring constant in the first direction with respect to the first elastic member)};

2*{(capacity of the second electrostatic capacitor in the second sensor)/(the spring constant in the second direction with respect to the second elastic member)}; and {(capacity of a part of the third electrostatic capacitor with respect to the first weight among weights included in the third sensor section)/(the spring constant in the third direction with respect to the first elastic member)+(capacity of a part of the third electrostatic capacitor with respect to the second weight among weights included in the third sensor section)/(the spring constant in the third direction with respect to the second elastic member).

The above indicated configuration corresponds to the contents described by referring to the equation (5). That is, the third sensor section includes a part of the third electrostatic capacitor with respect to the first weight and a part of the third electrostatic capacitor with respect to the second weight. Further, values of the below provided three expressions are set equal to one another: 2*{(capacity of the first electrostatic capacitor in the first sensor)/(the spring constant in the first direction with respect to the first elastic member)}; 2*{(capacity of the second electrostatic capacitor in the second sensor)/(the spring constant in the second direction with respect to the second elastic member)}; and {(capacity of a part of the third electrostatic capacitor with respect to the first weight among weights included in the third sensor section)/(the spring constant in the third direction with respect to the first elastic member)+(capacity of a part of the third electrostatic capacitor with respect to the second weight among weights included in the third sensor section)/(the spring constant in the third direction with respect to the second elastic member). By preparing respective elements so as to satisfy the above conditions, there can be easily constituted an acceleration sensor having equal acceleration sensitivity with three different directions orthogonal to one another.

According to technology disclosed in the present application there can be provided an acceleration sensor improving accuracy in detecting acceleration while satisfying degree of flexibility for designing miniaturized one.

It will be apparent for those skilled in the art various alternations, substitutions, improvements, combinations and the like can be made.

What is claimed is:

1. An acceleration sensor comprising:
a planar substrate;
a first weight;
a first set of one or more elastic members, each of the elastic members of the first set extending from the first weight and elastically supporting the first weight in a spaced relationship with the substrate while allowing the first weight to move in both (a) a first direction parallel to the plane of the substrate and (b) a second direction perpendicular to the plane of the substrate;
a second weight;
a second set of one or more elastic members, each of the elastic members of the second set extending from the second weight and elastically supporting the second weight in a spaced relationship with the substrate while allowing the second weight to move in both (a) a third direction which is both parallel to the plane of the substrate and perpendicular to the first direction and (b) the second direction; and
a sensor circuit for detecting acceleration in the first, second and third directions as a function of the movement of the first weight in the first and second directions and the movement of the second weight in the second and third directions.

2. The acceleration sensor of claim 1, further comprising a beam fixedly connected to the substrate and wherein at least one of the elastic members of the first set of elastic members is connected directly to the beam so that the first weight is supported by the beam via the at least one of the elastic members of the first set of elastic members.

3. The acceleration sensor of claim 1, wherein:
the first weight is planar in shape and has outer borders defining the shape of the first weight as viewed from a position perpendicular to a plane of the first weight; and
the first set of one or more elastic members are located within the borders of the first weight.

4. The accelerations sensor of claim 3, wherein:
the second weight is planar in shape and has outer borders defining the shape of the second weight as viewed from a position perpendicular to a plane of the second weight; and
the second set of one or more elastic members are located within the borders of the second weight.

5. The acceleration sensor of claim 1, wherein:
the first weight is planar in shape and has outer borders defining the shape of the first weight as viewed from a position perpendicular to a plane of the first weight; and
the sensor circuit includes a first sensor section having a first plurality of fixed electrodes located in a plane of the first weight and within the borders of the first weight.

6. The accelerations sensor of claim 5, wherein:
the second weight is planar in shape and has outer borders defining the shape of the second weight as viewed from a position perpendicular to a plane of the second weight; and
the sensor circuit further includes a second sensor section including a second plurality of fixed electrodes located in a plane of the second weight and within the borders of the second weight.

7. The acceleration sensor of claim 6, wherein:
the first sensor section comprises the first plurality of fixed electrodes and a first plurality of moveable electrodes opposing the first plurality of fixed electrodes and moving with the first weight to form a plurality of first capacitive members having a variable capacitance; and
the second sensor section comprises the second plurality of fixed electrodes and a second plurality of moveable electrodes opposing the second plurality of fixed electrodes and moving with the second weight to form a plurality of second capacitive members having a variable capacitance.

8. The acceleration sensor of claim 7, wherein the first plurality of fixed electrodes and the first plurality of movable electrodes are interdigitated.

9. The acceleration sensor of claim 8, wherein the second plurality of fixed electrodes and the second plurality of movable electrodes are interdigitated.

10. The acceleration sensor of claim 1, wherein:
the first set of one or more elastic members is configured such that a spring constant in the second direction is larger than spring constants in the first and third directions, and
the second set of one or more elastic members is configured such that a spring constant in the first direction is larger than spring constants in the second and third directions.

11. The acceleration sensor of claim 6, wherein the first and second sets of one or more elastic members are structurally identical and the first and second sensor sections are structurally identical.

* * * * *